United States Patent
Shimizu et al.

(10) Patent No.: US 8,557,719 B2
(45) Date of Patent: Oct. 15, 2013

(54) METHOD FOR FABRICATING SEMICONDUCTOR DEVICE

(75) Inventors: Wataru Shimizu, Saitama (JP); Ikuo Kurachi, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 7 days.

(21) Appl. No.: 12/379,195

(22) Filed: Feb. 13, 2009

(65) Prior Publication Data

US 2009/0209111 A1 Aug. 20, 2009

(30) Foreign Application Priority Data

Feb. 14, 2008 (JP) .................................. 2008-033384

(51) Int. Cl.
*H01L 23/29* (2006.01)
(52) U.S. Cl.
USPC .................... 438/791; 438/796; 257/E21.211; 257/E21.328; 257/E21.471
(58) Field of Classification Search
USPC .......................... 438/758, 778, 791, 795, 796; 257/E21.211, E21.328, E21.471
See application file for complete search history.

(56) References Cited

U.S. PATENT DOCUMENTS

2004/0166696 A1* 8/2004 Lee ................................ 438/792
2007/0018233 A1* 1/2007 Hayakawa .................... 257/316

FOREIGN PATENT DOCUMENTS

JP           8-78687        3/1996
JP       2002-203968 A  *  7/2002

* cited by examiner

*Primary Examiner* — William D Coleman
*Assistant Examiner* — Su Kim
(74) *Attorney, Agent, or Firm* — Rabin & Berdo, P.C.

(57) ABSTRACT

A method for fabricating a semiconductor device, according to the present invention includes the steps of: preparing an SOI substrate, which comprises a semiconductor supporting layer, an oxide layer formed on the semiconductor supporting layer and an SOI layer formed on the oxide layer; forming a semiconductor device on the SOI layer; forming a passivation layer over the SOI substrate, the passivation layer allowing a UV light to pass through it; and applying a UV light to the SOI substrate after the step of forming the semiconductor device is completed.

17 Claims, 17 Drawing Sheets

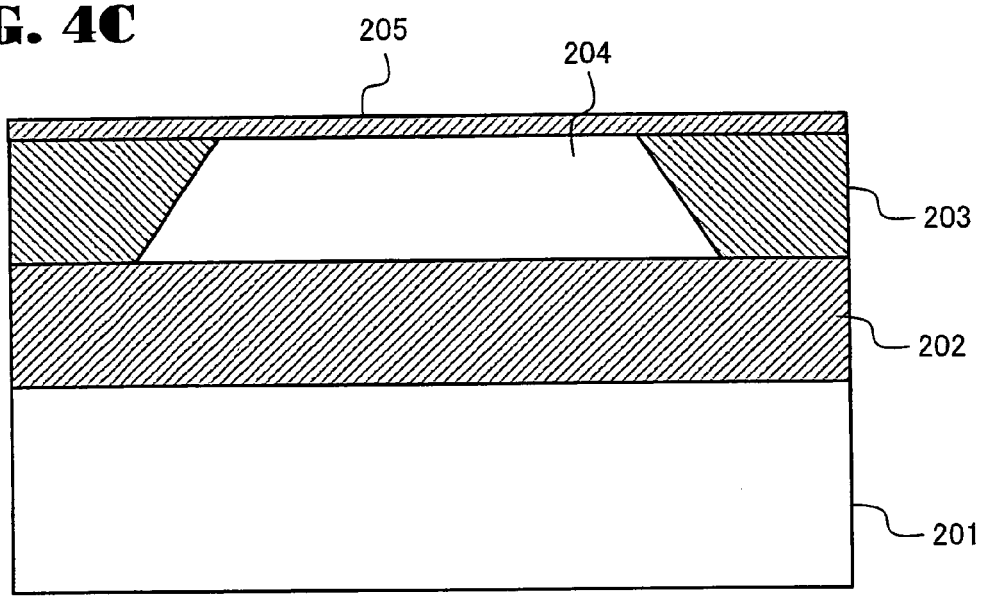
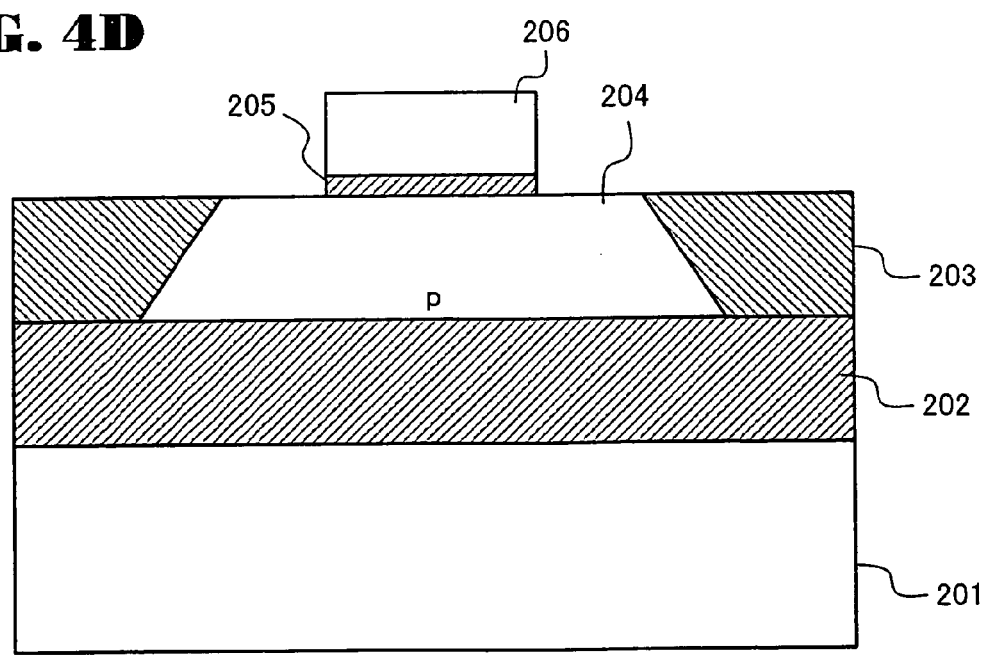

METHOD FOR FABRICATING SEMICONDUCTOR DEVICE

CROSS REFERENCE TO RELATED APPLICATION

This application claims the priority of Application No. 2008-033384, filed Feb. 14, 2008 in Japan, the subject matter of which is incorporated herein by reference.

TECHNICAL FIELD OF THE INVENTION

The present invention relates to a method for fabricating a semiconductor device using an SOI substrate. In particular, the present invention relates to a method for fabricating a SOI-MOSFET.

BACKGROUND OF THE INVENTION

A semiconductor device fabricated using a SOI (Silicon On Insulator) substrate has been widely used. An SOI substrate includes a silicon base layer, an oxide layer (BOX oxide layer) and a silicon layer formed on the oxide layer. As compared with a semiconductor device fabricated using a bulk silicon wafer, a MOSFET (Metal Oxide Semiconductor Field Effect Transistor) fabricated using an SOI wafer provides better characteristics. For example, according to a semiconductor device fabricated using an SOI wafer, there are advantages in that: a junction capacitance is remarkably low; latchup phenomenon does not occur; substrate floating effect is low; and sub-threshold characteristic is good.

In general, a SOI-MOSFET is designed so that operation current flows through a channel region located directly below a gate electrode. Now, a conventional fabrication process of a SOI-MOSFET is described using an N-channel transistor as an example referring to FIGS. 1A to 1K.

First, as shown in FIG. 1A, an SOI substrate is prepared. The SOI substrate includes a silicon substrate 101, a BOX oxide layer 102 formed on the silicon substrate 101 and an SOI layer 104 formed on the BOX oxide layer 102. Next, as shown in FIG. 1B, a device isolation region (STI) 103 is formed by a conventional process.

Next, as shown in FIG. 1C, a gate insulating layer (oxide layer) 105 is formed on the SOI layer 104 by a thermal diffusion process. Subsequently, an impurity is implanted into the SOI layer 104 by a well known technology in order to optimize the impurity concentration at a channel region in the SOI layer. After that, a poly-silicon layer is formed on the gate insulating layer 105, and the poly-silicon layer is etched to form a gate electrode 106, as shown in FIG. 1D.

Next, as shown in FIG. 1E, an impurity is ion-implanted into the SOI layer at a region (active region 104) out of the device isolating region 103 to form source/drain regions 110 of a MOSFET. The source/drain regions 110 and the active region 104 have the different (opposite) conductive types from each other. Next, as shown in FIG. 1F, an interlayer insulation layer 107 is formed over the waver entirely by a well know CVD process.

Next, apertures (contact holes) 108 are formed in the interlayer insulation layer 107 by a well know process of lithography and etching, as shown in FIG. 1G. The contact holes 108 are to be used for connecting electrically a later formed first wiring layer 109 to the source/drain regions 110 and to the gate electrode 106. Next, as shown in FIG. 1H, a metal layer (109) is formed over the wafer entirely to fill the apertures 108 by a well known sputtering process.

Subsequently, as shown in FIG. 1I, a first wiring layer 109 is shaped (formed) by a well know process of lithography and etching. After that, although an interlayer insulation layer and a wiring layer are multi-layered in general, the description of the multi-layered process is omitted.

Next, as shown in FIG. 1J, a passivation layer 120 of SiN is formed over a surface of the waver entirely by a well known CVD process to protect a surface of the device. After that, as shown in FIG. 1K, an aperture 111 is formed in the passivation layer 120 by a well known process of lithography and etching. The aperture 111 is to be used for connecting the first wiring layer 109 electrically to an external device.

According to an SOI-MOSFET fabricated by the above described conventional processes, problems are caused by: a removing (ashing) process of a resist used for a variety of etching processes and lithography process; a PID (Plasma-induced Damage) generated in a plasma process; and etc. As shown in FIG. 2, positive electric charges are trapped in the oxide layer 102 and at the boundary between the oxide layer 102 and the SOI layer 104. Such positive electric charges may include trapped charge (Qot), mobile ions (Qm), fixed charges (Qf) and interface traps (Qt). Such problems are occurred especially based on PID in an etching process to form the gate electrode; an etching process to form the contract holes; an etching process to form the wiring layer; and an etching process to form the aperture in the passivation layer.

In FIG. 2, normally only a channel region 113, which is formed by applying a voltage to the gate electrode 106, contributes current flowing when the MOSFET is operating. However, according to the conventional device, a channel 114 is also formed as a parasitic transistor around a bottom of the SOI layer 104 due to positive charges generated by PID. As a result, as shown in FIG. 3, characteristics of the MOSFET are diverged from the desired characteristics. In other words, a hump characteristic occurs.

Patent Publication 1 (JP2002-203968A) discloses a method for fabricating a MOSFET in which a LTV (Ultra-violet) light is applied during the fabrication process for a variety of purposes. It is known that harmful effect of PID, including fixed charges in the oxide layer and charged trapped between (boundary of) the oxide layer and the SOI layer, can be removed by applying a UV light to the MOSFET. However, after the process of applying a UV light, harmful effect of PID is generated again.

[Patent Publication 1] JP2002-203968A

OBJECTS OF THE INVENTION

Accordingly, an object of the present invention is to provide a method for fabricating a semiconductor device, which can reduce harmful effect of PID sufficiently.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a method for fabricating a semiconductor device includes the steps of: preparing an SOI substrate, which comprises a semiconductor supporting layer, an oxide layer formed on the semiconductor supporting layer and an SOI layer formed on the oxide layer; forming a semiconductor device on the SOI layer; forming a passivation layer over the SOI substrate, the passivation layer allowing a UV light to pass through it; and applying a UV light to the SOI substrate after the step of forming the semiconductor device is completed.

According to the present invention, a UV light passes through a passivation layer, and a UV light is applied after the final process of fabrication of the device. Therefore, harmful effect of PID, which has been accumulated until the process of applying a UV light, could be removed sufficiently. As a result, a semiconductor device would have satisfactory characteristics without a hump characteristic.

BRIEF DESCRIPTION OF THE DRAWINGS

FIGS. 4A to 4L are cross-sectional views illustrating fabricating steps of an SOI-MOSFET according to the present invention.

DESCRIPTION OF REFERENCE NUMERALS

201: Si Supporting Substrate
202: Isolation Oxide Layer (BOX oxide layer)
203: Device Isolating Region
204: SOI Region
205: MOS Oxide Layer (Gate Oxide Layer)
206: Gate Electrode
207: Interlayer Insulation Layer
208: Contact Hole
209: First Wiring Layer
220: Passivation Layer

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1A:
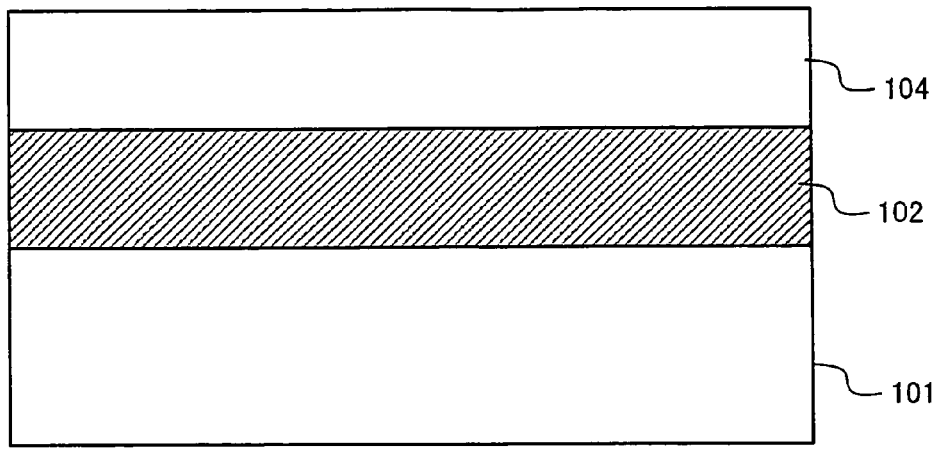
FIGS. 1A to 1K are cross-sectional views illustrating fabricating steps of a conventional SOI-MOSFET.
Figure 1B:
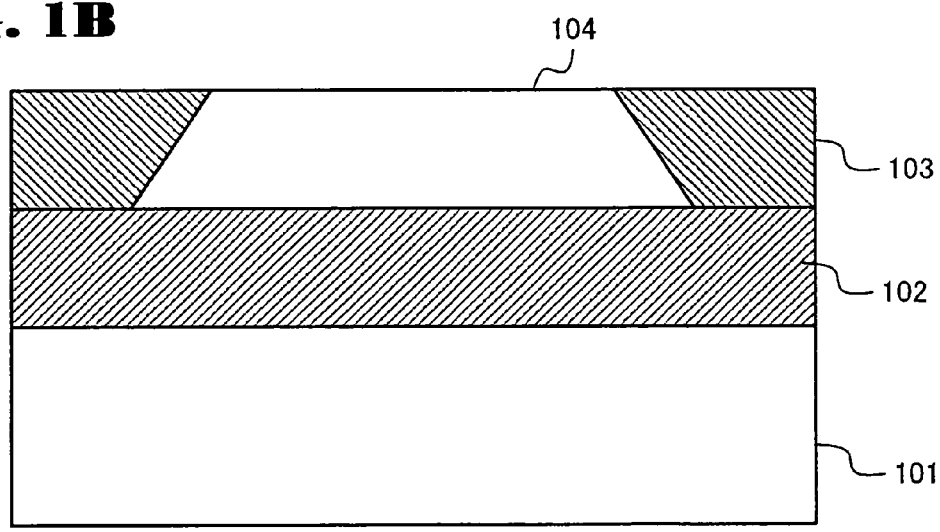
Figure 1C:
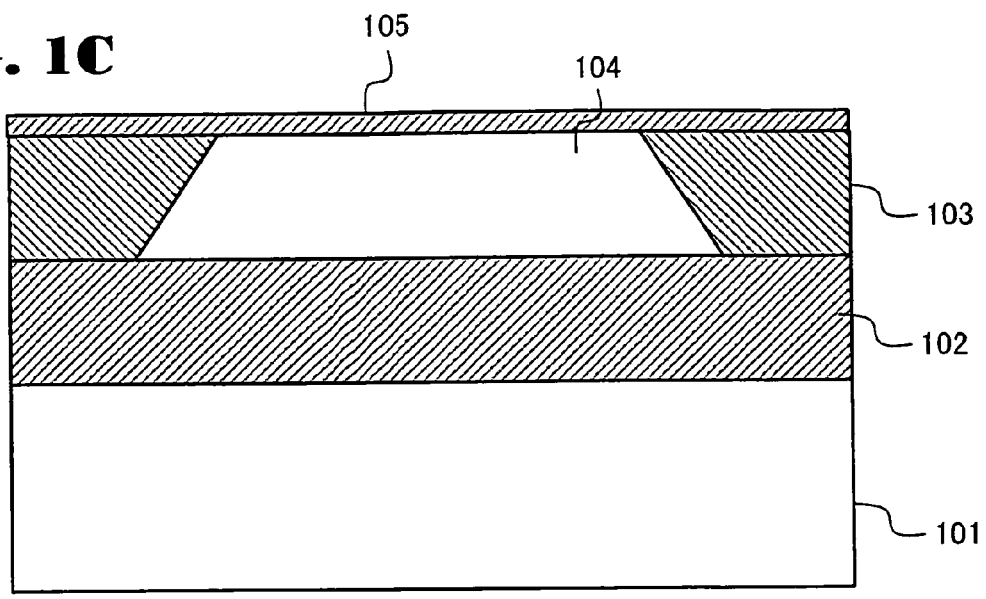
Figure 1D:
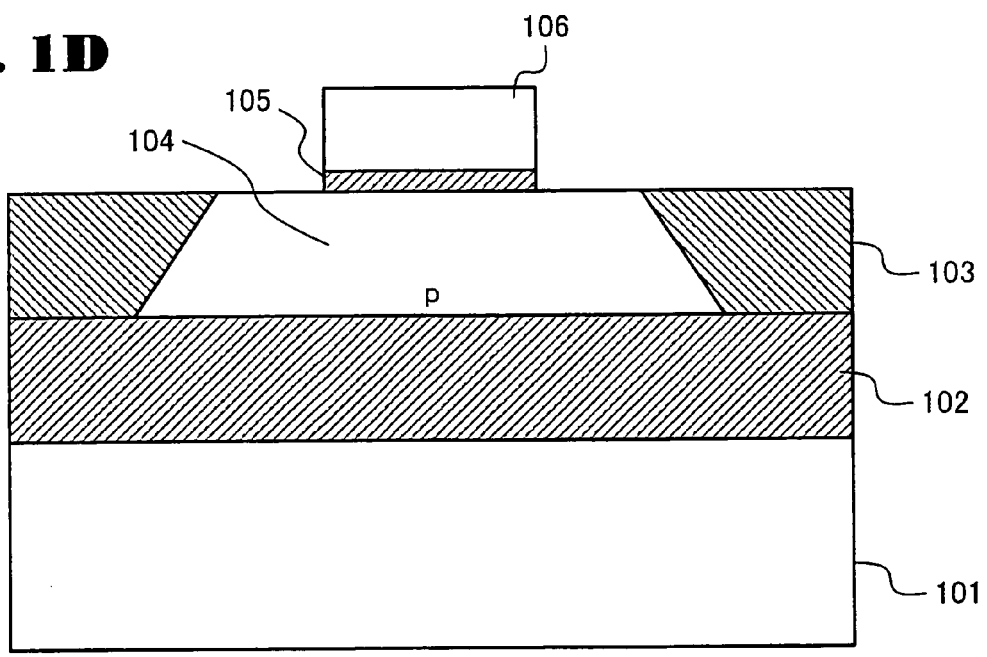
Figure 1E:
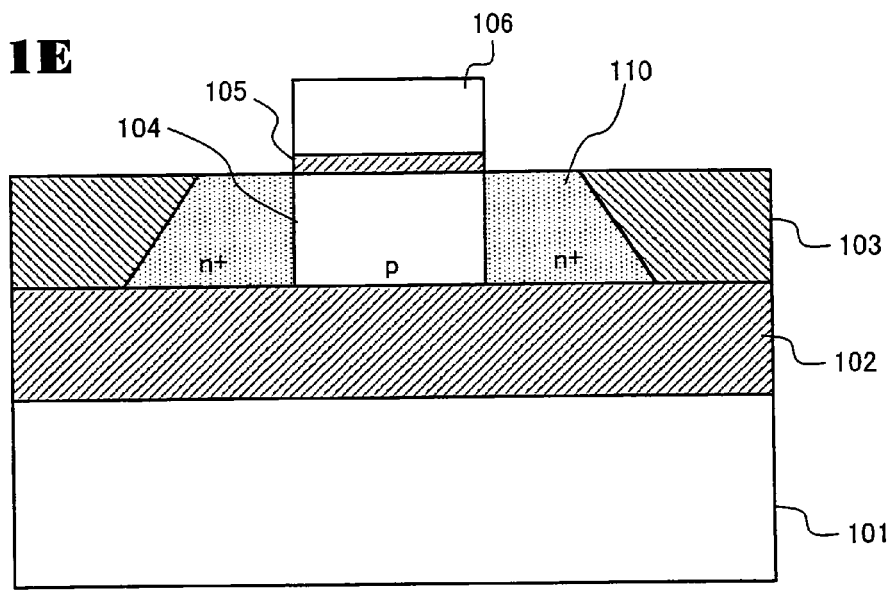
Figure 1F:
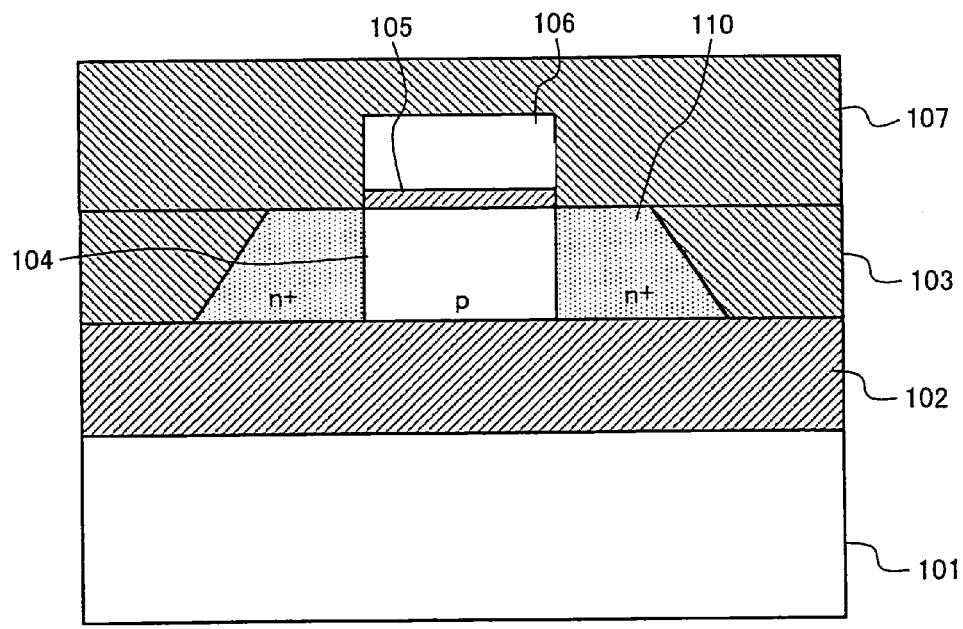
Figure 1G:
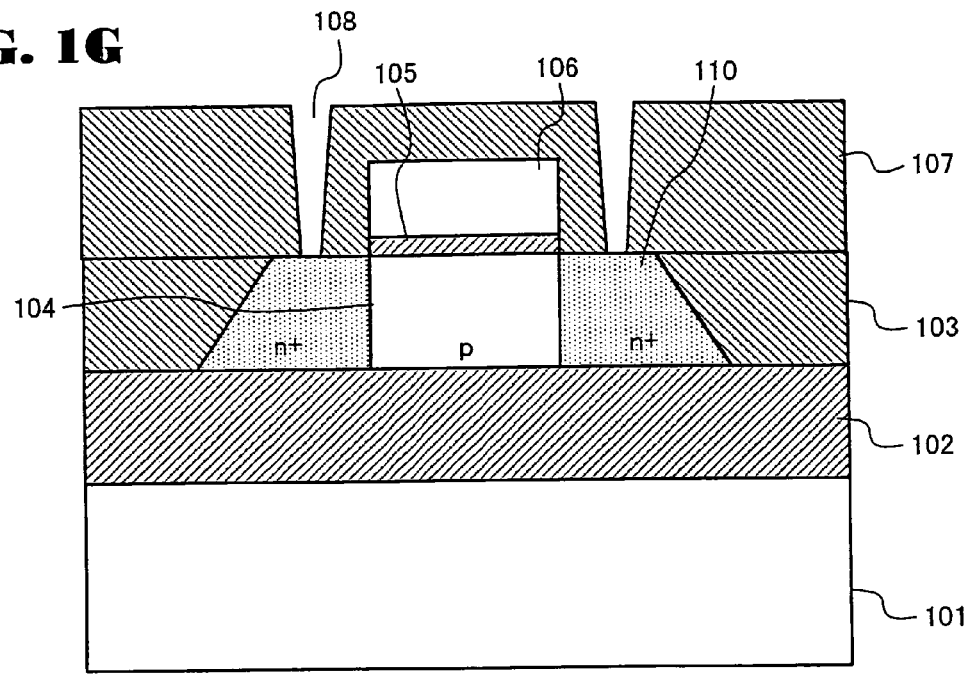
Figure 1H:
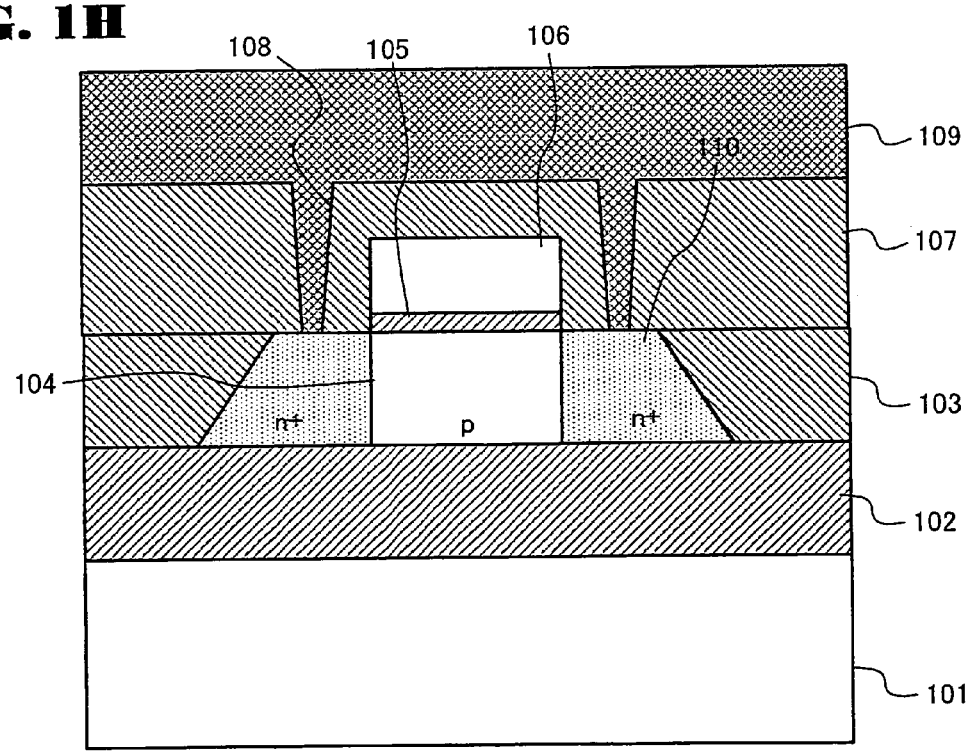
Figure 1I:
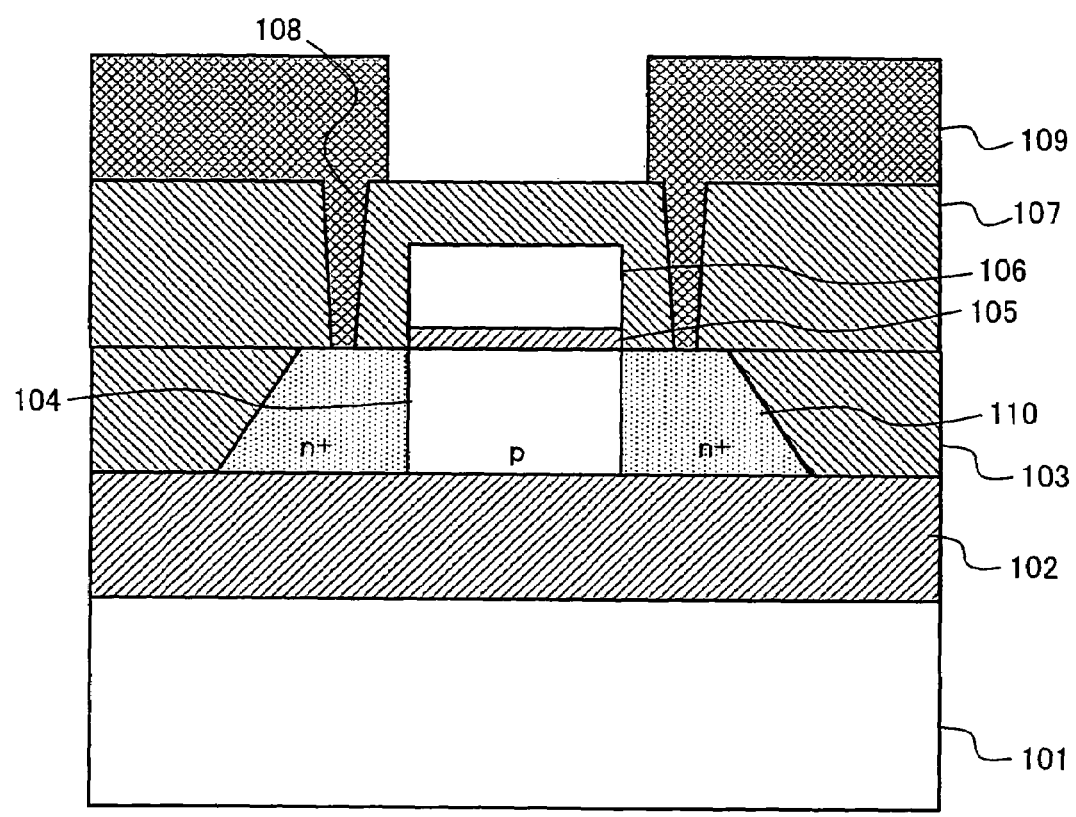
Figure 1J:
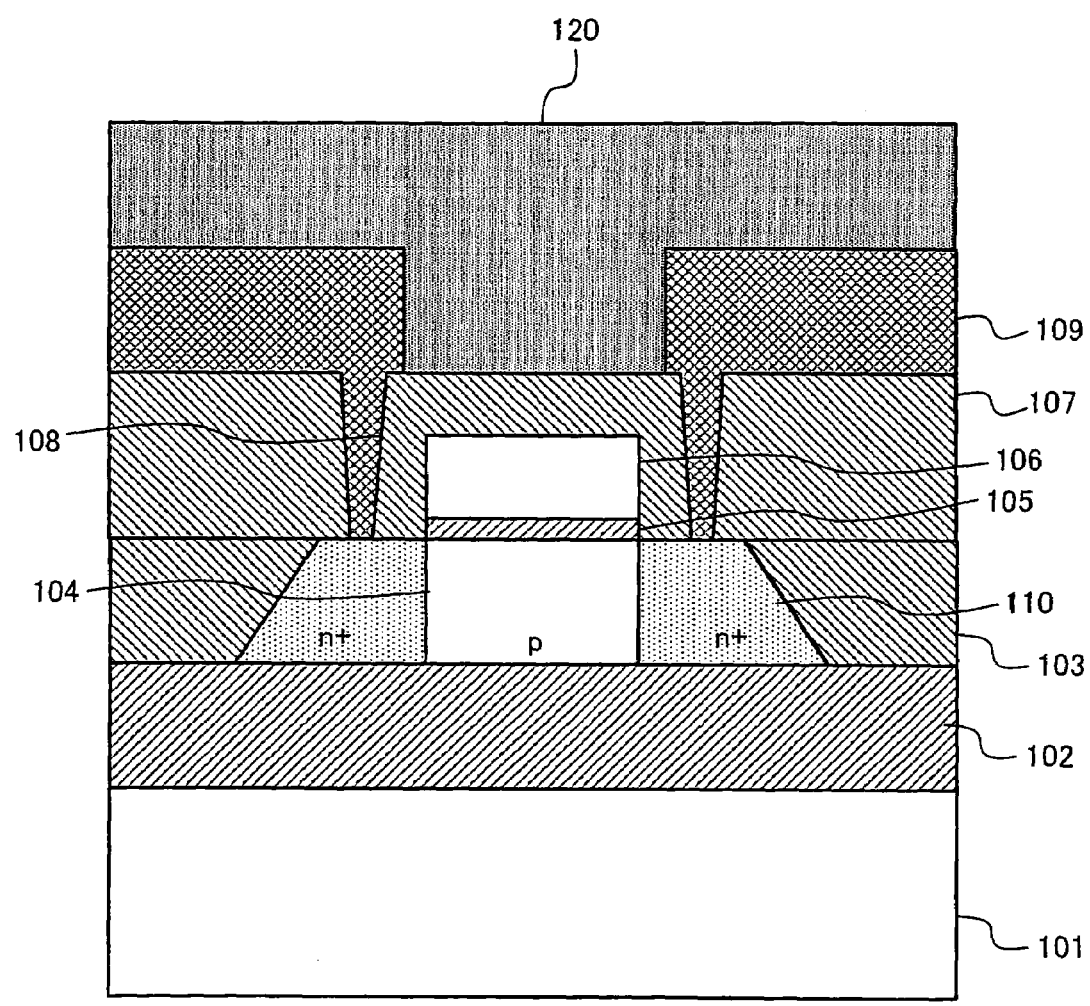
Figure 1K:
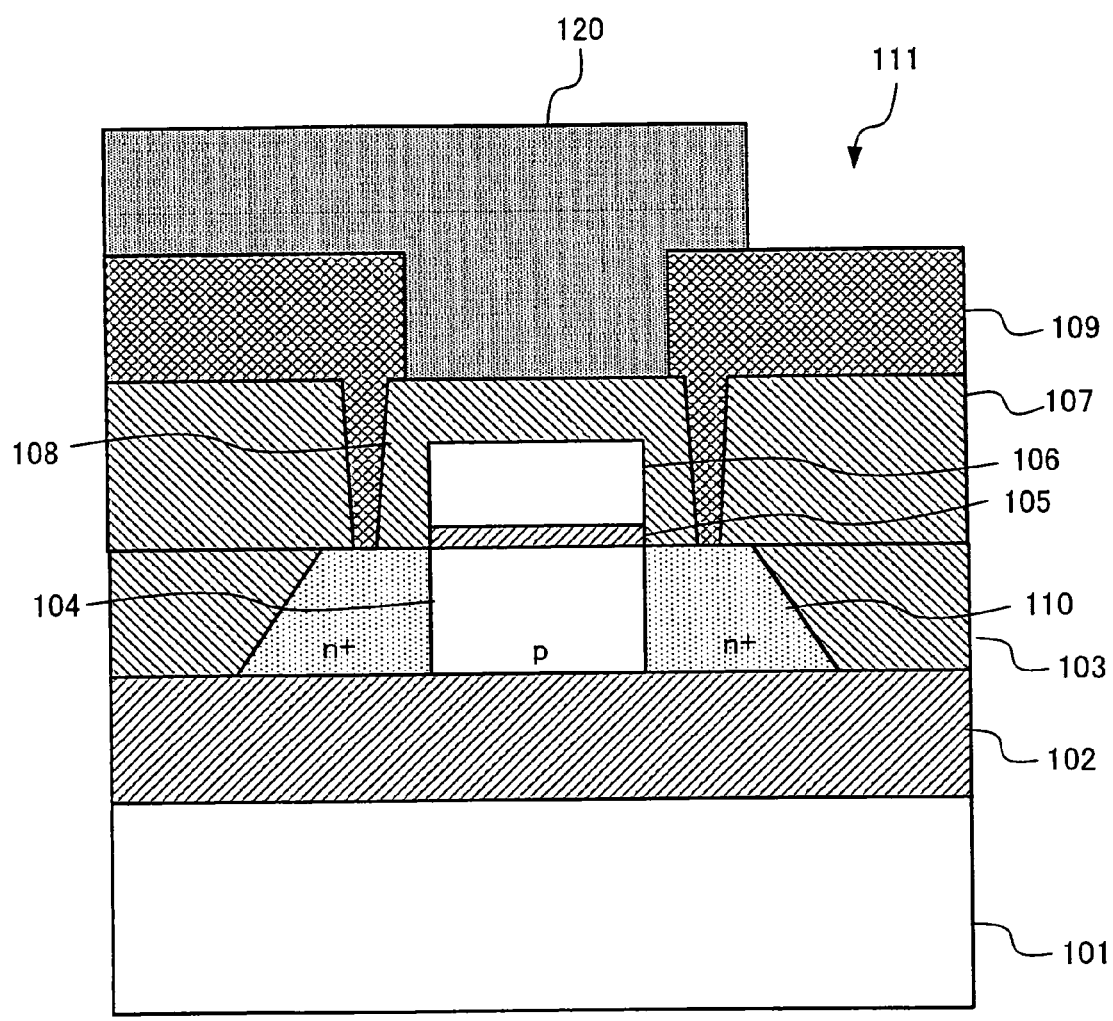
Figure 2:
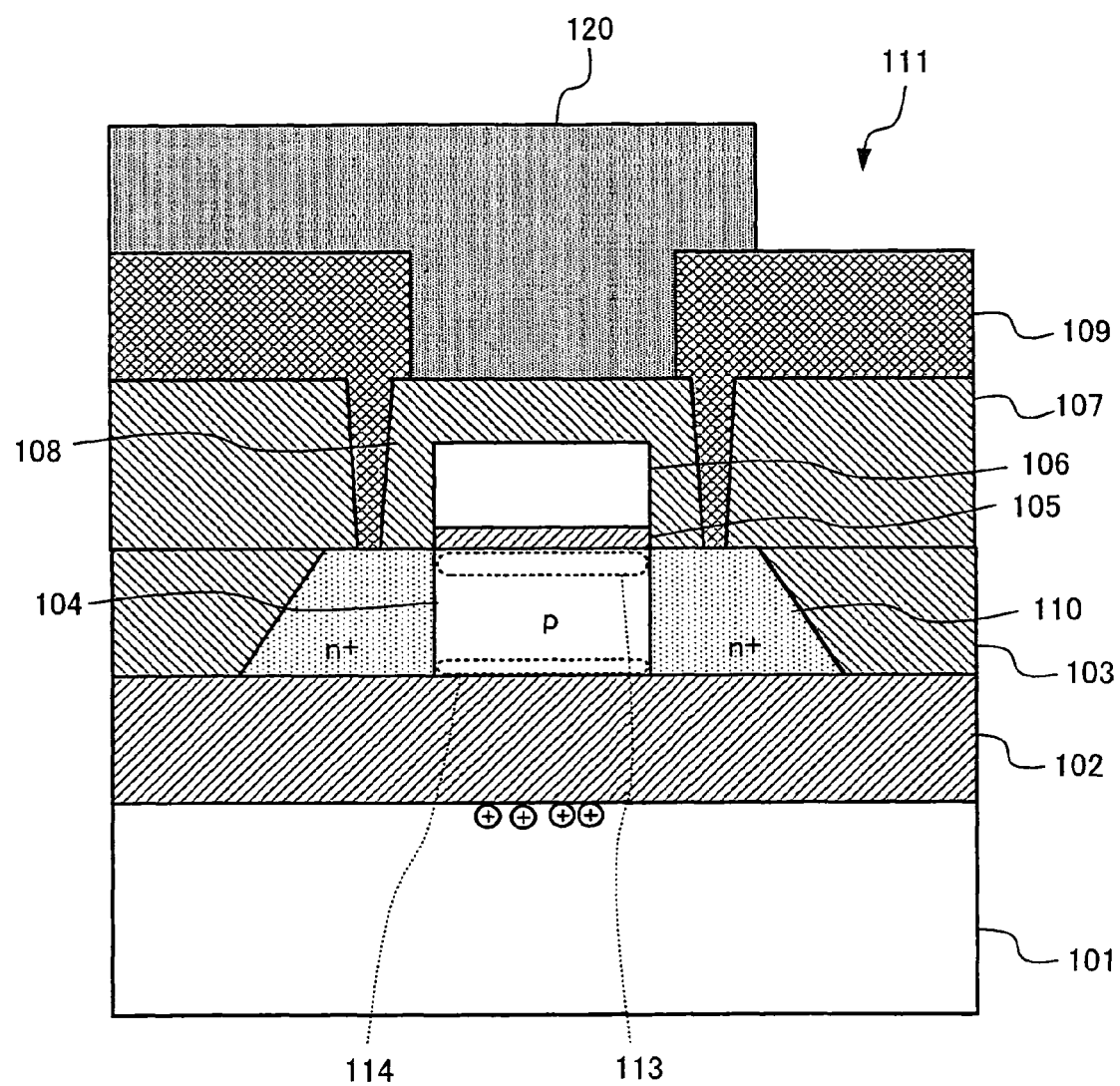
FIG. 2 is a cross-sectional view showing a conventional SOI-MOSFET.
Figure 3:
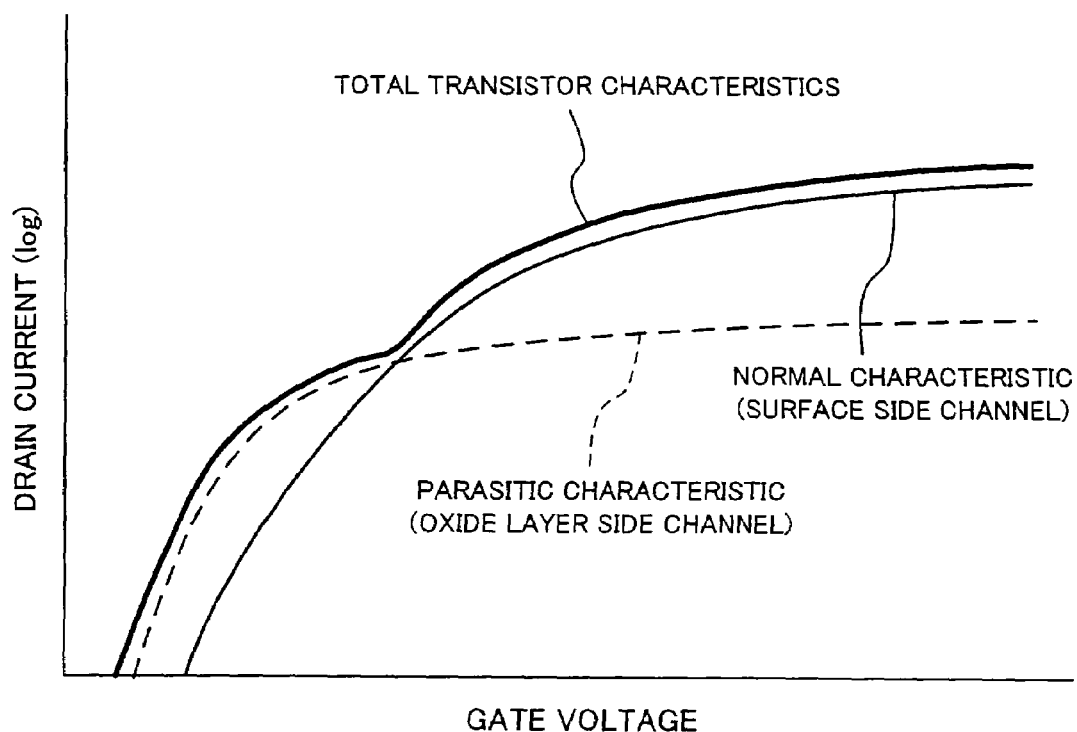
FIG. 3 is a graph showing a characteristic of a conventional SOI-MOSFET.
Figure 4A:
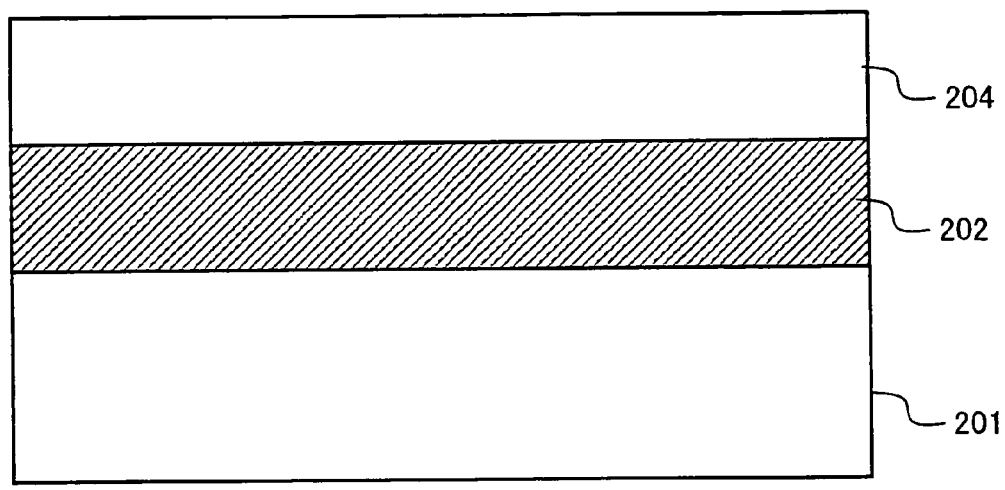
Figure 4B:
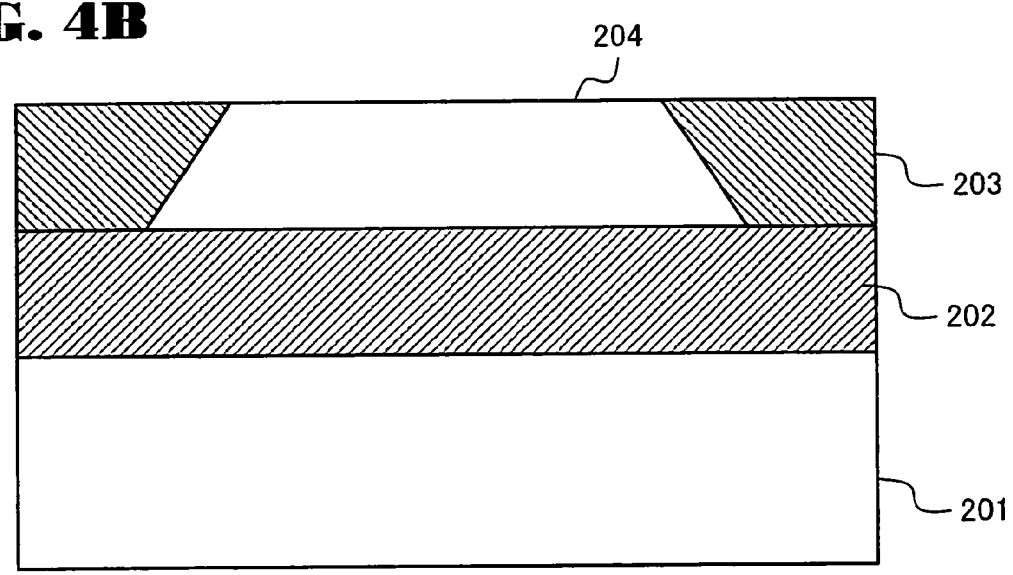

FIGS. 4A to 4L are cross-sectional views illustrating fabricating steps of an SOI-MOSFET according to the present invention. First, as shown in FIG. 4A, an SOI substrate is prepared. The SOI substrate includes a silicon substrate 201, a BOX oxide layer 202 formed on the silicon substrate 201 and an SOI layer 204 formed on the BOX oxide layer 202. Next, as shown in FIG. 4B, a device isolation region (STI) 203 is formed by a conventional process.

Next, as shown in FIG. 4C, a gate insulating layer (oxide layer) 205 is formed on the SOI layer 204 by a thermal diffusion process. Subsequently, an impurity is implanted into the SOI layer 204 by a well known technology in order to optimize the impurity concentration at a channel region in the SOI layer. After that, a poly-silicon layer is formed on the gate insulating layer 205, and the poly-silicon layer is etched to form a gate electrode 206, as shown in FIG. 4D.

Figure 4E:
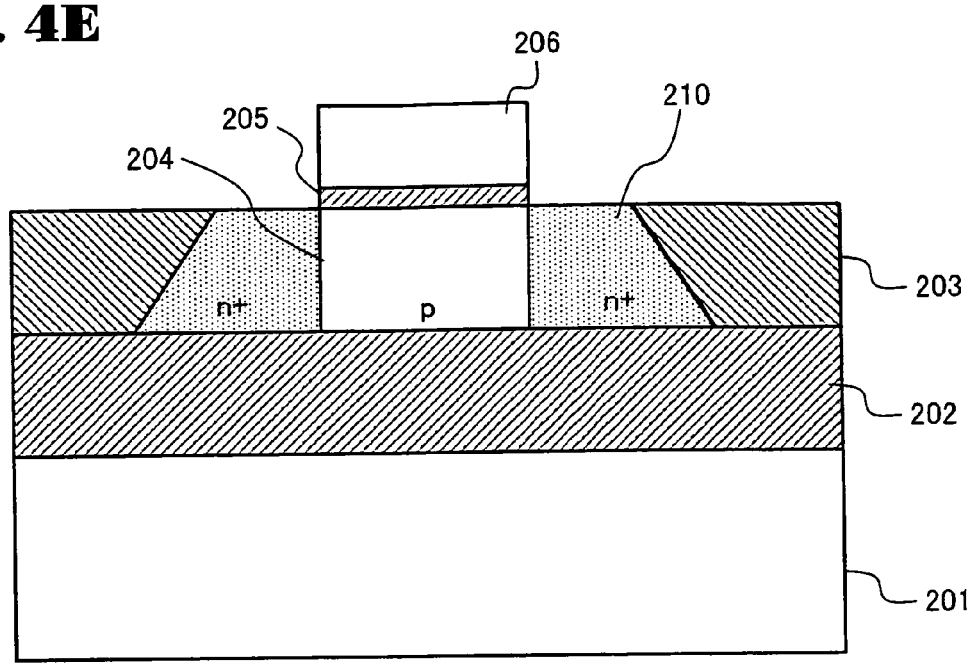
Figure 4F:
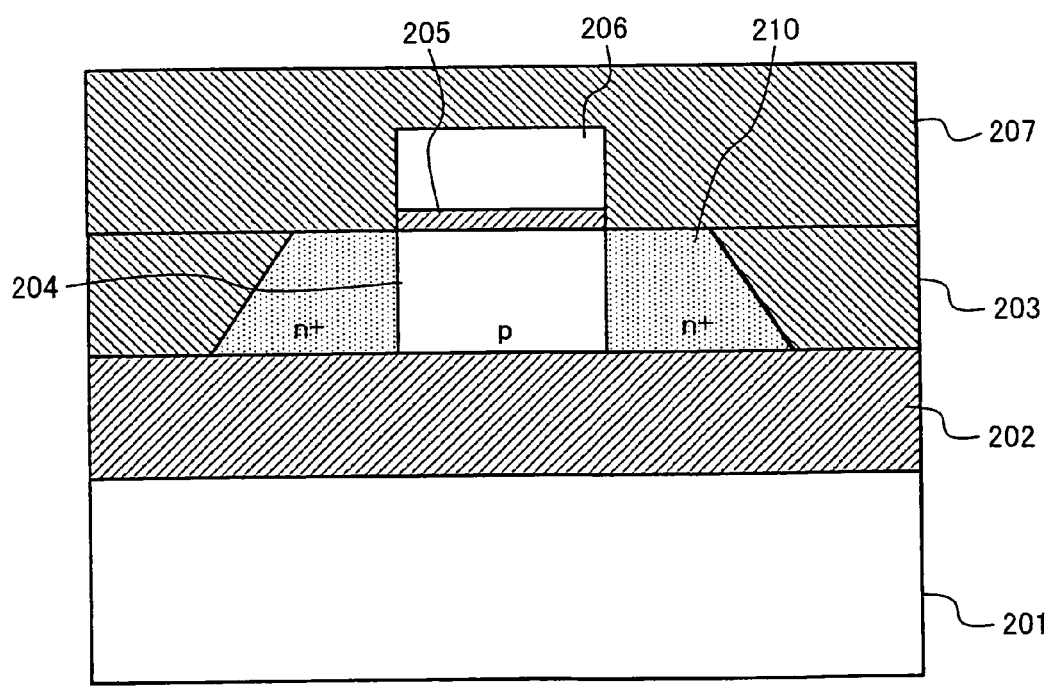

Next, as shown in FIG. 4E, an impurity is ion-implanted into the SOI layer at a region (active region 204) out of the device isolating region 203 to form source/drain regions 210 of a MOSFET. The source/drain regions 210 and the active region 204 have the different (opposite) conductive types from each other. Next, as shown in FIG. 4F, an interlayer insulation layer 207 is formed over the waver entirely by a well know CVD process.

Figure 4G:
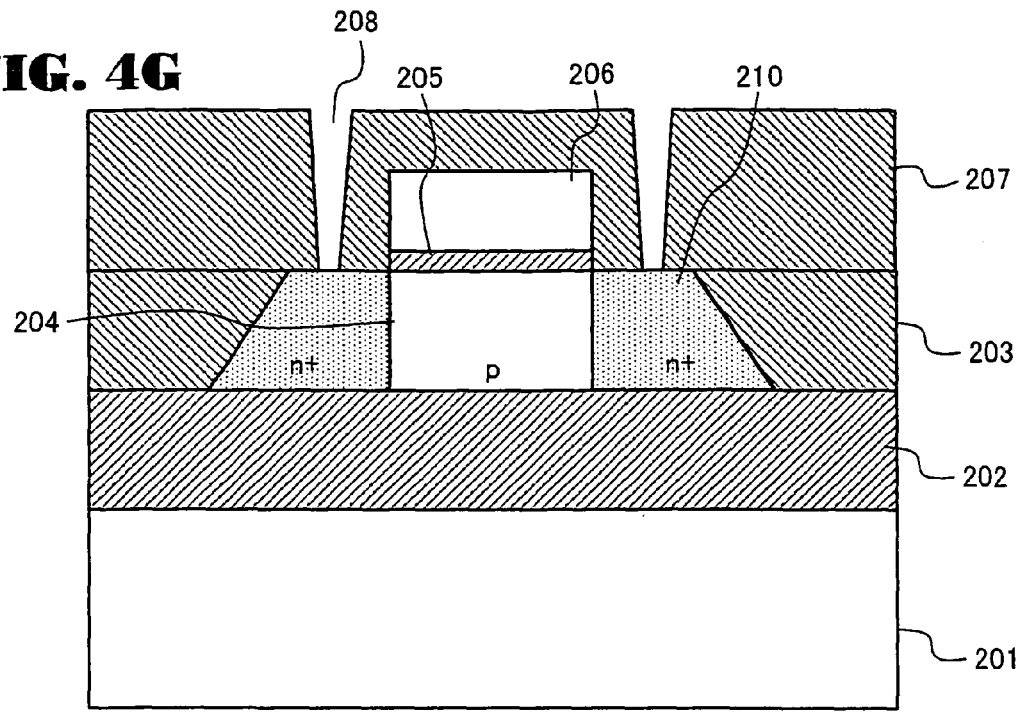
Figure 4H:
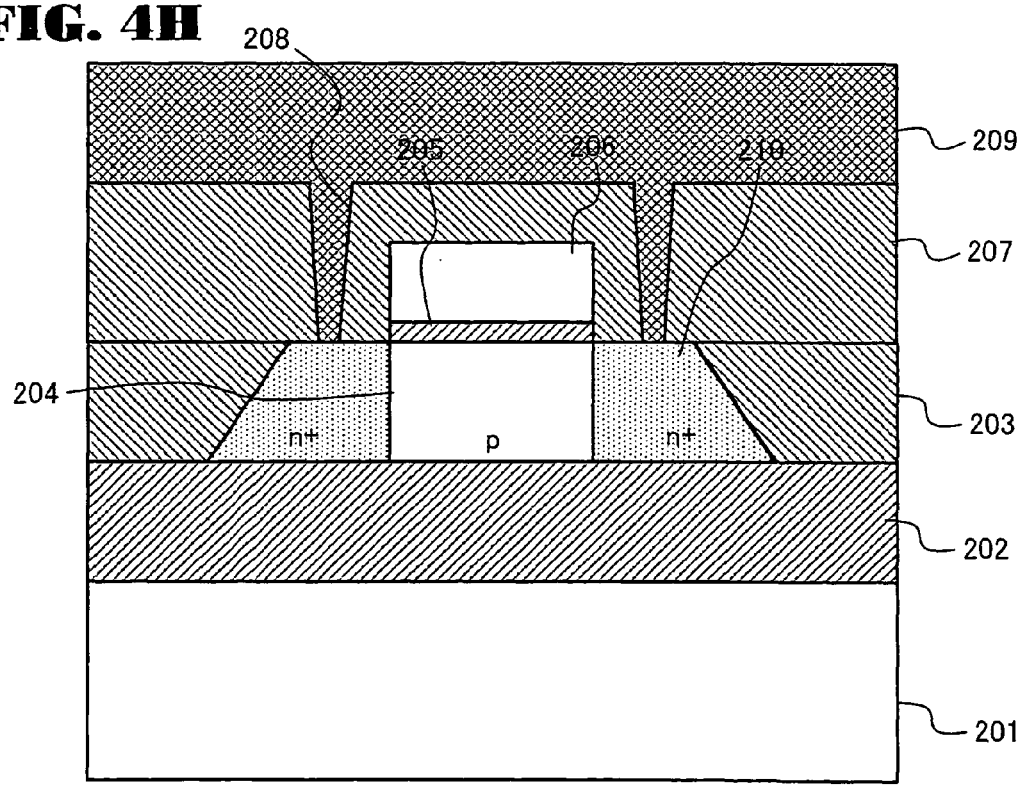

Next, apertures (contact holes) 208 are formed in the interlayer insulation layer 207 by a well know process of lithography and etching, as shown in FIG. 4G. The contact holes 208 are to be used for connecting electrically a later formed first wiring layer 209 to the source/drain regions 210 and to the gate electrode 206. Next, as shown in FIG. 4H, a metal layer (209) is formed over the wafer entirely to fill the apertures 208 by a well known sputtering process.

Figure 4I:
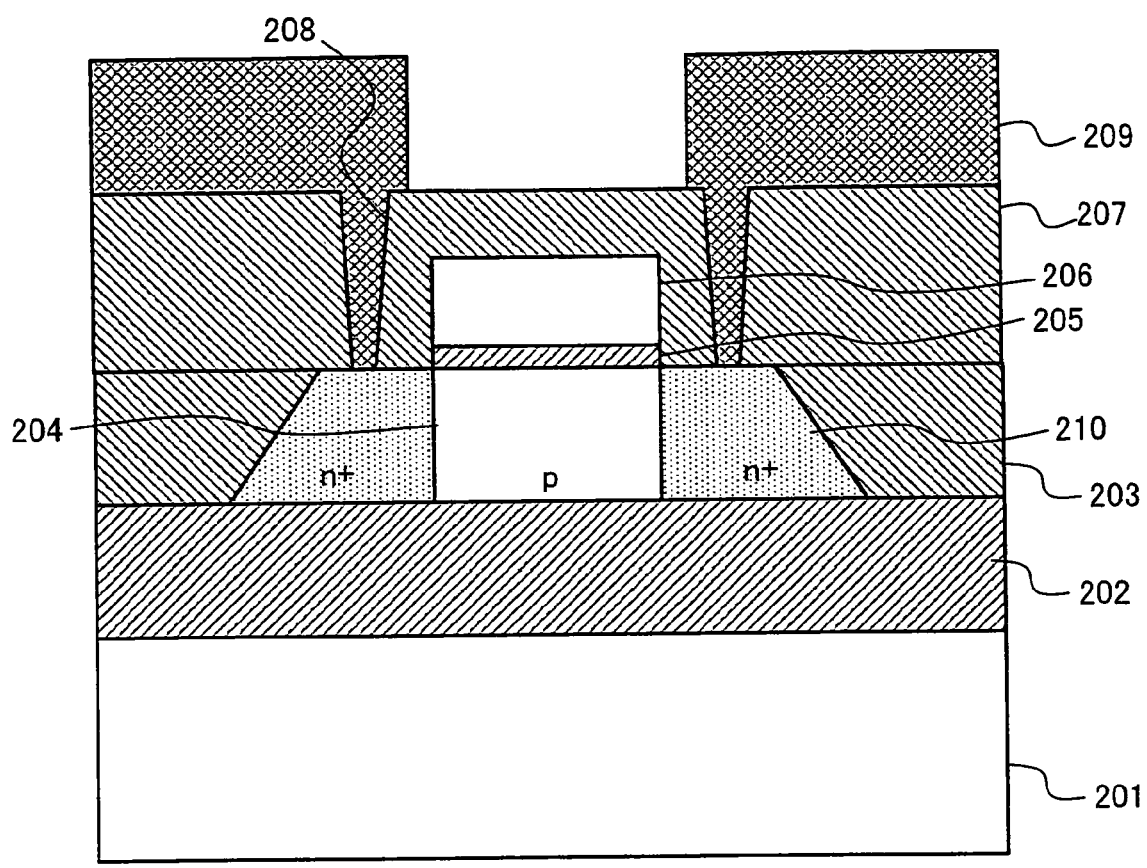

Subsequently, as shown in FIG. 4I, a first wiring layer 209 is shaped (formed) by a well know process of lithography and etching. After that, although an interlayer insulation layer and a wiring layer are multi-layered in general, the description of the multi-layered process is omitted.

Figure 4J:
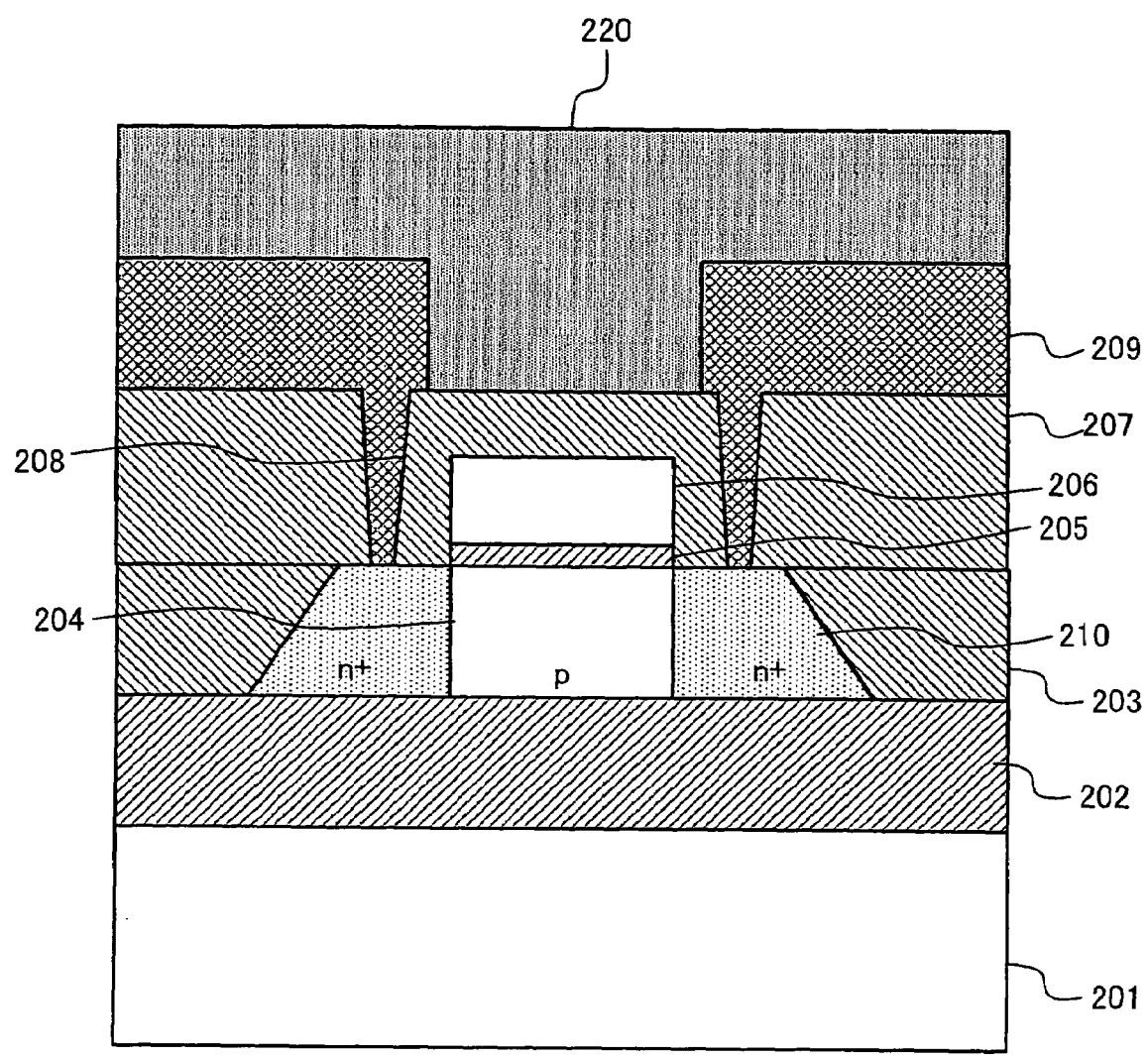

Next, as shown in FIG. 4J, a passivation layer 220 of SiN is formed over a surface of the waver entirely by a well known CVD process to protect a surface of the device. The passivation layer 220 is made of Si3N4, which has a UV transmissivity of 75% to 85%. Preferably, the ratio of Si and N (SiN ratio) is determined to be about 0.88.

Figure 4K:
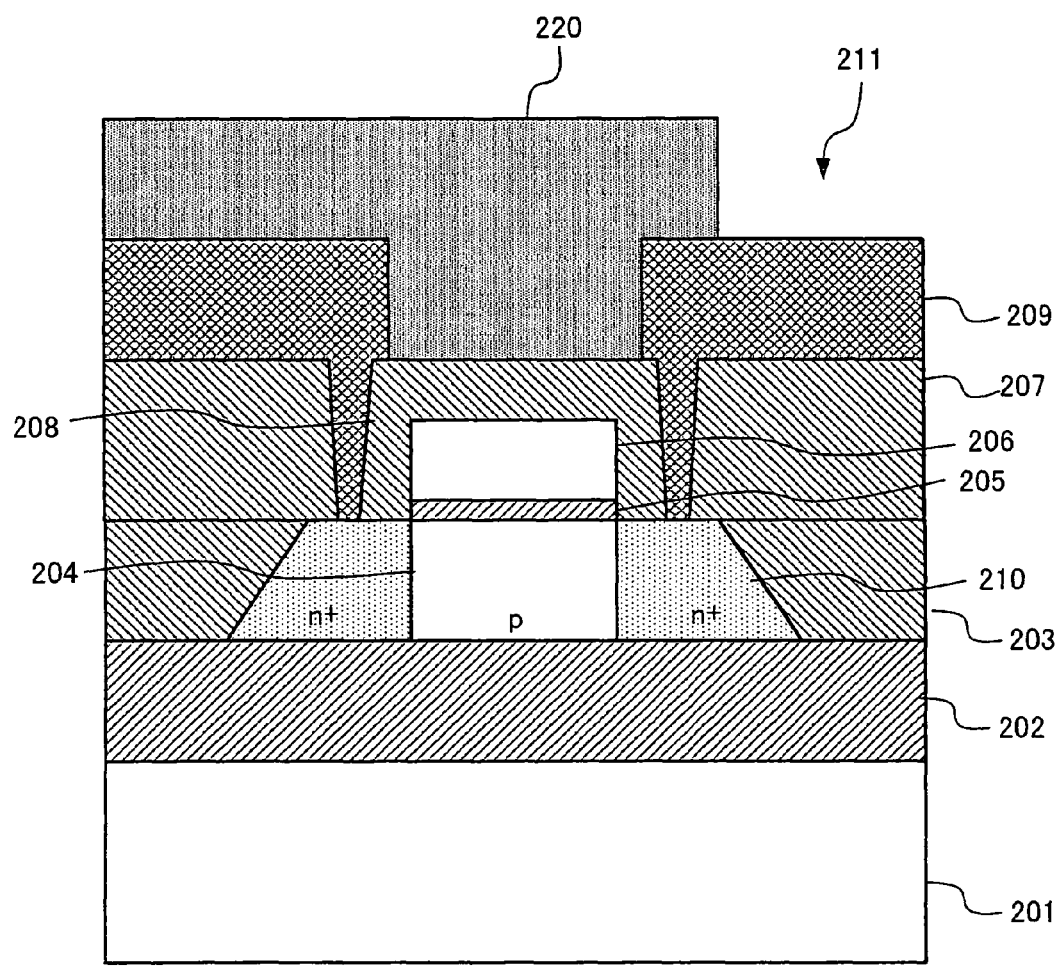

After that, as shown in FIG. 4K, an aperture 211 is formed in the passivation layer 220 by a well known process of lithography and etching. The aperture 211 is to be used for connecting the first wiring layer 209 electrically to an external device.

Figure 4L:
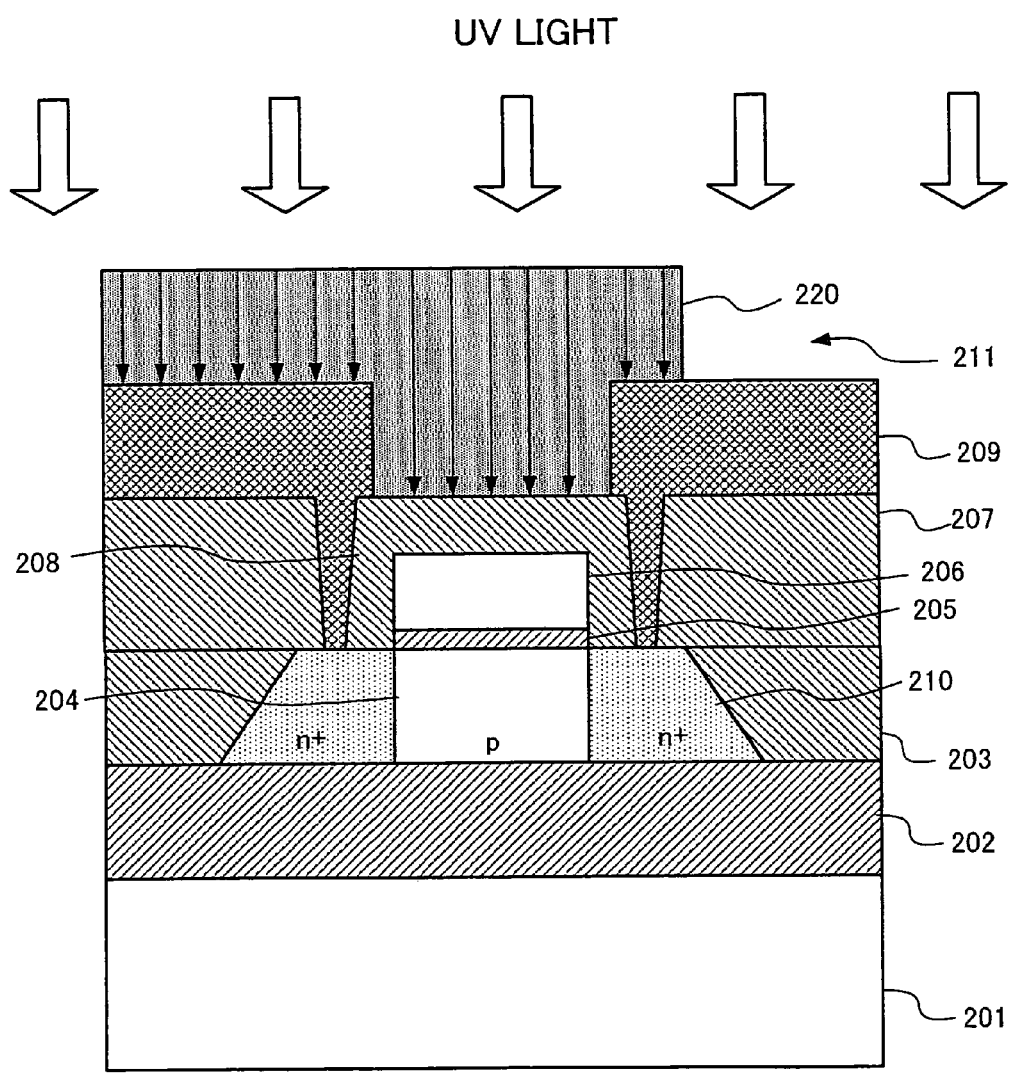

Next, as shown in FIG. 4L, a UV light is applied to the wafer entirely. Such a UV light may have a wavelength of 350 nm or less. The UV light is applied for 100 sec with an illumination of 230 mW/cm2 to 800 mW/cm2.

It is not required to apply a UV light to the wafer entirely, but at least around an interface (boundary face) between the oxide layer 202 and the SOI layer 204. If a UV light is applied only around the interface (boundary face) between the oxide layer 202 and the SOI layer 204, in the step shown in FIG. 4J, a passivation layer would be made of a material in which a UV light does not pass through instead of the passivation layer 220 having a characteristic of UV transmissivity. After that, another aperture is formed at a region where a UV light is to be applied at the same time of forming the aperture 211. Subsequently, the passivation layer 220 having a characteristic of UV transmissivity is formed over the wafer entirely, so that the aperture 211 is filled with the passivation layer 220. Next, the passivation layer 220 is removed from the aperture 211.

What is claimed is:

1. A method for fabricating a semiconductor device, comprising:
preparing an SOI substrate which comprises a semiconductor supporting layer, an oxide layer formed on the semiconductor supporting layer and an SOI layer formed on the oxide layer;
forming a semiconductor device on the SOI layer;
forming a passivation layer over the SOI substrate, the passivation layer allowing a UV light to pass through it;
forming an aperture in the passivation layer for supplying an external electric power; and directly subsequently to forming the aperture in the passivation layer, applying a UV light to the SOI substrate to fully deplete the SOI substrate of positive electric charges.

2. A method for fabricating a semiconductor device according to claim 1, wherein the passivation layer is made of SiN having a transmissivity of 75% to 85%.

3. A method for fabricating a semiconductor device according to claim 1, wherein the passivation layer is made of SiN having a Si/N ratio of about 0.88.

4. A method for fabricating a semiconductor device according to claim 2, wherein the passivation layer is made of SiN having a Si/N ratio of about 0.88.

5. A method for fabricating a semiconductor device according to claim 1, wherein the UV light is applied with an illumination not lower than 230 mW/cm2.

6. A method for fabricating a semiconductor device according to claim 4, wherein the UV light is applied with an illumination not lower than 230 mW/cm2.

7. A method for fabricating a semiconductor device according to claim 1, wherein in the step of applying a UV light, the UV light is applied to at least a boundary between the oxide layer and SOI layer.

8. A method for fabricating a semiconductor device according to claim 1, further comprising removing a portion of the passivation layer to form another aperture that the UV light is to be transmitted through to the SOI substrate.

9. A method for fabricating a semiconductor device according to claim 1, wherein the step of applying a UV light includes applying the UV light to the SOI substrate for 90 seconds to 110 seconds.

10. A method for fabricating a semiconductor device, the method comprising:
    preparing an SOI substrate which comprises a semiconductor supporting layer, an oxide layer formed on the semiconductor supporting layer and an SOI layer formed on the oxide layer;
    forming a semiconductor device on the SOI layer;
    forming a passivation layer over the SOI substrate, the passivation layer allowing a UV light to pass through it;
    forming an aperture in the passivation layer for supplying an external electric power; and
    directly subsequently to forming the aperture in the passivation layer, applying a UV light to an interface of the oxide layer and the SOI layer of the SOI substrate to fully deplete the SOI substrate of positive electric charges.

11. A method for fabricating a semiconductor device according to claim 10, further comprising:
    forming another aperture in the passivation layer so that the UV light may be transmitted through the another aperture to the interface.

12. A method for fabricating a semiconductor device according to claim 10, wherein during the applying of the UV light, the semiconductor device is electrically disconnected from any other device.

13. A method for fabricating a semiconductor device according to claim 10, wherein forming the passivation layer occurs after forming the semiconductor device.

14. A method for fabricating a semiconductor device according to claim 10, wherein during the applying of the UV light, the UV light is applied with an illumination of 230 mW/cm2 to 800 mW/cm2.

15. A method for fabricating a semiconductor device according to claim 1, wherein during the applying of the UV light, the semiconductor device is electrically disconnected from any other device.

16. A method for fabricating a semiconductor device according to claim 1, wherein forming the passivation layer occurs after forming the semiconductor device.

17. A method for fabricating a semiconductor device according to claim 10, wherein during the applying of the UV light, the UV light is applied with an illumination of 230 mW/cm2 to 800 mW/cm2.

* * * * *